(12) United States Patent
Spencer et al.

(10) Patent No.: US 7,388,498 B2
(45) Date of Patent: Jun. 17, 2008

(54) METHOD AND SYSTEM FOR PRODUCING AND READING LABELS BASED ON MAGNETIC RESONANCE TECHNIQUES

(75) Inventors: Paul Spencer, Pullman, WA (US); Edwin Hirahara, Federal Way, WA (US); David L. Lee, Tacoma, WA (US)

(73) Assignee: Weyerhaeuser Company, Federal Way, WA (US)

(*) Notice: Subject to any disclaimer, the term of this patent is extended or adjusted under 35 U.S.C. 154(b) by 179 days.

(21) Appl. No.: 11/241,110

(22) Filed: Sep. 30, 2005

(65) Prior Publication Data

US 2007/0075865 A1 Apr. 5, 2007

(51) Int. Cl.
*G08B 13/14* (2006.01)

(52) U.S. Cl. ............... 340/572.5; 340/5.86; 340/5.8; 324/300

(58) Field of Classification Search ........... 340/572.5, 340/572.3, 572.1, 5.8; 324/300, 307, 309, 324/316, 327
See application file for complete search history.

(56) References Cited

U.S. PATENT DOCUMENTS

| | | | | |
|---|---|---|---|---|
| 5,554,974 | A * | 9/1996 | Brady et al. | 340/572.6 |
| 5,986,550 | A * | 11/1999 | Rapaport et al. | 340/572.3 |
| 6,008,888 | A * | 12/1999 | Nottke et al. | 356/71 |
| 6,477,227 | B1 * | 11/2002 | Kaiser et al. | 378/45 |
| 6,750,756 | B2 * | 6/2004 | Stevenson et al. | 340/5.86 |
| 6,811,657 | B2 * | 11/2004 | Jaso | 204/192.13 |
| 6,879,385 | B2 * | 4/2005 | Neda et al. | 356/71 |
| 2006/0265139 | A1 * | 11/2006 | van der Weide et al. | 702/22 |

OTHER PUBLICATIONS

Bingham SJ et al., "The design and sensitivity of microwave frequency optical heterodyne receivers," *Rev Sci Instrum* 69 3403-3409 (1998).

Bingham SJ et al., "Optical detection of transition metal ion electron paramagnetic resonance by coherent Raman spectroscopy," *Chem Phys* Letters 266: 543-547 (1993).

Blasberg T et al, "Determination of the absolute sign of nuclear quadrupole interactions by laser radio-frequency double-resonance experiments," *Phys Rev B* 48: 9524-9527 (1993).

(Continued)

*Primary Examiner*—George A Bugg
*Assistant Examiner*—Hoi C Lau
(74) *Attorney, Agent, or Firm*—Christensen O'Connor Johnson Kindness

(57) ABSTRACT

The invention provides a method and system for labeling items, wherein the labels contain digital information and can be read when desired. The coding of the labels is done by choosing specifically engineered nano-particles, micro-particles, or liquid material in the form of "ink." The particles are designed to contain materials with distinguishable NMR (nuclear magnetic resonance) or NQR (Nuclear quadrupole resonance) frequencies and are combined in sets to encode digital information. The NMR/NQR label particle sets are printed on the item to be labeled, or on a label substrate which is then attached to the item to be labeled. In one embodiment, the printed NMR/NQR label consists of an array of spots, each of which may encode one or more digital characters. These spots can be detected and the digital information in the label can be read using a suitable magnetic resonance detector.

15 Claims, 4 Drawing Sheets

OTHER PUBLICATIONS

Harle P et al., "A nuclear-spin based rotation sensor using optical polarization and detection methods," *Appl Magn Reson* 5: 207-2220 (1993).

Moerner WE et al, "Optical detection and spectroscopy of single molecules in a solid," *Amer Phys Soc* 62: 2535-2538 (1989).

Suter D, "Sensitivity of optically excited and detected magnetic resonance," *J Mag Res* 99: 495-506 (1992).

Wratchup J et al, "Opitcal detection of magnetic resonance in a single molecule," *Let to Nature* 353: 244245 (1993).

* cited by examiner

METHOD AND SYSTEM FOR PRODUCING AND READING LABELS BASED ON MAGNETIC RESONANCE TECHNIQUES

FIELD OF THE INVENTION

The invention is directed generally to labeling items and, more specifically, to labeling items using ink formed of particles having specific magnetic resonance characteristics so that the resulting labels can be read using magnetic resonance techniques.

BACKGROUND OF THE INVENTION

Labels or identification tags are useful for storing information about the items carrying the labels or identification tags. They can be used for inventory purposes, tracking items during shipping, and storing various useful information about the items such as their prices, serial numbers, contents, etc.

Traditionally, labels or identification tags have been handwritten or printed, which can be read by humans. These labels or tags can also be read by a computer using suitable optical character recognition (OCR) software.

There are also various types of electronically readable labels. For example, one-dimensional optical bar codes are readable with a scanned light beam and a light sensitive detector, as typically used in a grocery store scanner.

Two-dimensional optical bar codes are more compact (or dense) and can store much more information than one-dimensional optical bar codes. Their read-out method, however, is correspondingly more complicated than that which is used for reading one-dimensional optical bar codes because of the more complex label format and also because a higher optical resolution is usually required.

Magnetic ink labels are read by a head similar to a tape recording head or by a hall-effect or other magnetic detector. The labels themselves can be simple one-dimensional bar codes, two-dimensional bar codes, or include characters that can also be read by humans. Examples of such labels are the bank account numbers found at the bottom of personal checks.

Fluorescent dots are micro- or nano-sized particles containing materials which fluoresce when illuminated with light of a particular wavelength (usually blue or ultraviolet). The particles can be made in different versions, each with a different emitted-light color. These particles can be applied to a surface, either as a single color or as a mixture of some colors, in patches or as one- or two-dimensional bar codes. The particles may be made small enough to be placed on or in a very small sample, or even on single cells or molecules. The color or information of the label including fluorescent dots can be observed or read microscopically.

A Radio Frequency Identification (RFID) tag is a small circuit on a semiconductor chip. The circuit consists essentially of a small computer, a radio receiver, and a radio transmitter, which can send stored information when commanded by an external signal. A significantly greater amount of information can be encoded using this method than other labeling methods described above. Some RFID tags can be read at some distance (10 feet or greater) from the tag.

For some applications or users, it may be desirable to have a proprietary labeling system wherein labels are unreadable by common label reading systems or by humans. Such labels are preferably capable of permanently storing a digitally coded message containing a substantial amount of information. These labels or identification tags are further preferably organic and/or recyclable so that they can be placed on recyclable materials such as cardboard boxes. The present invention is directed to providing a labeling system and method which meet these and other goals.

SUMMARY OF THE INVENTION

In accordance with one embodiment of the present invention, a method is provided for making and reading a label. The method includes generally three steps. First, particles having different magnetic resonance characteristics are prepared and provided. Second, one or more of the particles are selectively arranged on or in an item to form a label. Third, magnetic resonance characteristics of the one or more of the particles placed on or in the item are detected so as to determine which particles are present on or in the label based on the detected magnetic resonance characteristics. In the second step, the one or more of the particles may be placed directly on or in the item to be labeled, or placed on a label, which in turn may be adhered or affixed to the item to be labeled.

In accordance with another embodiment of the present invention, the step of selectively placing one or more of the particles on or in an item further includes two sub-steps. First, sets of particles are prepared, wherein each set contains a different group of one or more of the particles such that the different sets signify different digital characters, respectively. For example, if eight different particles having different magnetic resonance characteristics are available, these particles may be used to form different sets to signify 8-particle characters, similarly to 8-bit ASCII characters.

In accordance with one aspect of the present invention, the particles are arranged in an array on or in an item to form a label, and positions of the particles within the label may be determined based on the detection of magnetic resonance characteristics corresponding to different positions in the array. The array may be one-dimensional, as in a bar code, or may be two-dimensional, so as to encode more information.

In accordance with another aspect of the present invention, the particles having different magnetic resonance characteristics are prepared by using various methods, such as: (1) by choosing chemical compounds containing different nuclei with a magnetic moment; (2) by choosing chemical compounds containing different spin-spin relaxation time (T2), (3) by choosing chemical compounds containing different chemical shifts or chemical shift patterns, and (4) by choosing chemical compounds containing different NQR resonance frequencies.

In accordance with yet another aspect of the present invention, the step of detecting magnetic resonance characteristics of the one or more of the particles is carried out by using a magnetic resonance or quadrupole resonance spectrometer, by using magnetic resonance imaging, by using a magnetic resonance force microscope, or by using an optically enhanced and optically detected NMR (nuclear magnetic resonance) or NQR (nuclear quadrupole resonance) reader.

The present invention further offers a system for reading a label. The system includes generally two elements: a label formed of particles having different magnetic resonance characteristics, and a detector configured to detect magnetic resonance characteristics of the particles so as to determine which particles are present on or in the label based on the detected magnetic resonance characteristics.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In accordance with various exemplary embodiments, the present invention is directed to creating particles containing materials having specific magnetic resonance characteristics. The particles are designed so that they can be placed in or on an item to be labeled or tagged, or in or on a label or tag itself. By selectively combining or arranging particles having different magnetic resonance characteristics to form a label or tag, digital information can be coded onto the label or tag, which can be read based on magnetic resonance techniques such as nuclear magnetic resonance (NMR) and nuclear quadrupole resonance (NQR) techniques. In other words, the presence or absence and/or position of each of the different types of particles can be detected and used to decode information encoded on/in the label or tag. In various exemplary embodiments of the present invention, such particles can be made of organic and/or recyclable materials so as to form an organic and/or recyclable label or tag.

Figure 1:
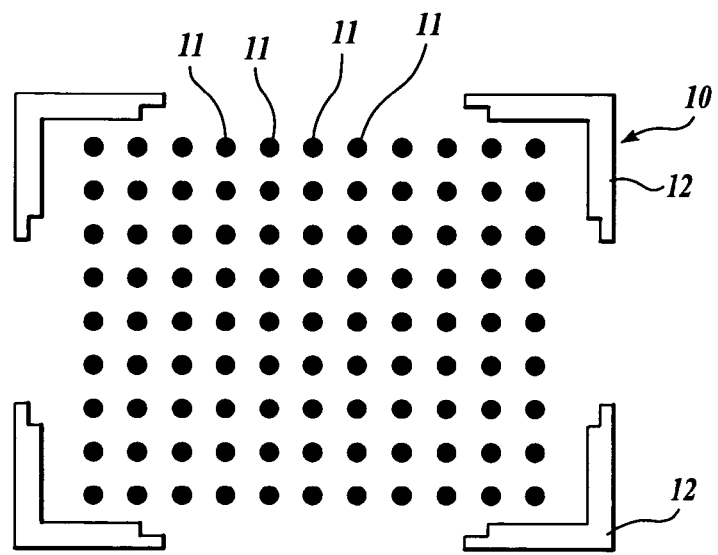
FIG. 1 illustrates a sample label including a plurality of spots made of particles having specific magnetic resonance characteristics, formed in accordance with one embodiment of the present invention.

FIG. 1 illustrates a label 10 suitable for use in the present invention, including a number of spots 11 enclosed in fiducial marks 12. The spots 11 may be formed of ink including particles, which in turn are formed of materials having different magnetic resonance characteristics. In other words, the particles are formed of specific materials having unique magnetic resonance characteristics so as to produce unique magnetic resonance signals. Thus, by selectively combining and arranging these particles to form the spots 11, one can encode information onto the label 10, which can then be decoded by using a suitable magnetic resonance detector such as an NMR detector or an NQR detector.

As should be apparent to one skilled in the art, the shape of each of the spots 11 is not limited to a generally round shape as illustrated, and may be a stripe (bar) shape, prism shape, or any other shape, as long as each spot can be distinctively recognized as such based on some magnetic resonance techniques. The fiducial marks 12 are used to allow a magnetic resonance detector to determine the location, orientation, and extent (size) of the label 10. To that end, the fiducial marks 12 may be formed of a material different from the materials used to form the particles forming the spots 11.

The spots 11 may be provided by printing inks, painting paints, etc., wherein the inks and paints are formed of particles including materials having specific magnetic resonance characteristics, such as magnetic resonance frequencies. The printing or painting may be carried out using any suitable method such as letterpress and mechanical or thermal ink jet printing. The spots 11 may be placed (e.g., printed) directly on or in an item to be labeled or tagged, or may be placed (e.g., printed) on or in a label (or identification tag), which in turn may be affixed to the item to be labeled or tagged using adhesive or any suitable mechanical attaching means. The label or identification tag may be formed of any material suitable for providing a substrate, such as paper and plastic. Further alternatively, instead of placing (e.g., printing) spots 11 on an item or a label, one or more particles including materials having specific magnetic resonance characteristics may be mixed with the material that forms the item to be labeled, so as to inherently "label" the item.

Various methods are possible to form different particles from materials so that the resulting different particles will have different magnetic resonance characteristics, respectively. In the first embodiment of a method of the present invention, one may select the types of nuclei with magnetic moments or quadrupole moments (for example, protons, $^{13}C$, $^{35}Cl$, etc.) to be detected, so as to prepare the particles having specific magnetic resonance characteristics. In this embodiment, the number of different materials to be used to form the particles is limited by the number of nuclei with magnetic or quadrupole moments to be detected.

In the second embodiment of a method of the present invention, one may select compounds containing nuclei with different T2's (spin-spin relaxation times), so as to prepare the particles having specific magnetic resonance characteristics. The T2 property is typically used to distinguish different tissue types in magnetic resonance imaging (MRI) for medical diagnosis.

In the third embodiment of a method of the present invention, one may select compounds with different chemical shifts or chemical shift patterns. (The resonance frequency can be shifted for nuclei in different positions in a molecule and is different for different types of molecules, which is called "chemical shift").

In the fourth embodiment of a method of the present invention, one may use compounds with different quadrupole resonance frequencies. Briefly, quadrupole resonance is similar to magnetic resonance, except that an external magnetic field is not used. Some nuclei have a quadrupole magnetic moment, and a resonance or splitting of energy level is caused by an electric field at the position of the nucleus. The fourth embodiment has the advantage of not requiring an external magnetic field for the purpose of detection. It also has the advantage that it would permit making a large number of particles having different NQR frequencies simply by making different chemical compounds using any known chemistry techniques. This is because the NQR frequency is determined by both the quadrupole moment of a nucleus and the electric field gradient at the position of the nucleus. Since the latter depends on the material in the chemical compound and the symmetry of various lattice positions in a solid compound, it is possible to readily design compounds with different NQR frequencies.

The particles may be macro-sized particles or nano-sized particles. Additionally or alternatively, micro-encapsulated particles could be used, in which the surface of a particle is made of a different material from that of the interior of the particle. For such micro-encapsulated particles, the interior could be either a liquid, a solid, or a solid made up of powder or a mixture of powders. A liquid could be a compound, a solvent containing dissolved material, or a suspension.

Still referring to FIG. 1, various arrangements of the spots 11 to encode information are possible, which may in part be dependent on the type of magnetic resonance detector used to read the label 10. In one embodiment, the spots 11 may be arranged in a 2-dimensional array, as shown in FIG. 1, while in another embodiment the spots 11 may be arranged in a one-dimensional array, such as in the form of stripes in a 1D bar code. The choice between 1D or 2D code arrangement may depend on various considerations, such as the sensitivity and resolution of a magnetic resonance detector, amount of information to be stored, etc.

In various exemplary embodiments of the present invention, multiple sets of particles are used, wherein each set includes one or more particles so that each set can signify a specific digital character (e.g., alphabet or number). For example, if eight types of distinguishable particles are available, these particles can be used to form (or not to form) a spot (e.g., eight different spots, respectively), so that their presence or absence may collectively represent an 8-bit ASCII character. Then, a series of 8-particle sets could spell out any desired message. Similarly, sixteen types of distinguishable particles may be created and used to form a set, to thereby represent a 16-bit character such as Unicode characters. Any number of particles may be printed onto a single spot by mixing the particles in ink or paint or by overprinting (i.e., printing one type of particles over another type of particles).

The coding schemes described above, such as the 8-bit and 16-bit coding schemes, are possible even when a magnetic resonance detector could detect only the presence or absence of various particles and could not detect the position of the particles. This is because, in the above-described coding schemes, different particles are used to represent different digits in these coding schemes, respectively. In some other applications, where a magnetic resonance detector is capable of further detecting the position of a particle producing a distinctive magnetic resonance signal, then further alternative coding schemes can be used. For example, the 8-bit ASCII characters may be represented using only one type of particles having a specific magnetic resonance characteristic, as long as the detector could determine the position of each particle in an array of 8 spots. In the present description, labels or identification tags that are digitally encoded and could be read based on magnetic resonance techniques (e.g., NMR and NQR) are termed NMR/NQR labels.

Systems for reading the NMR/NQR labels (or identification tags) are now described. These systems are configured to detect magnetic resonance signals produced by the particles forming the NMR/NQR labels based on magnetic resonance techniques. In accordance with the present invention, generally four embodiments of such systems are disclosed: (1) magnetic resonance or quadrupole resonance spectrometers; (2) magnetic resonance imaging devices; (3) magnetic resonance force microscopes, and (4) optically enhanced and optically detected NMR or NQR detection devices.

Figure 2:
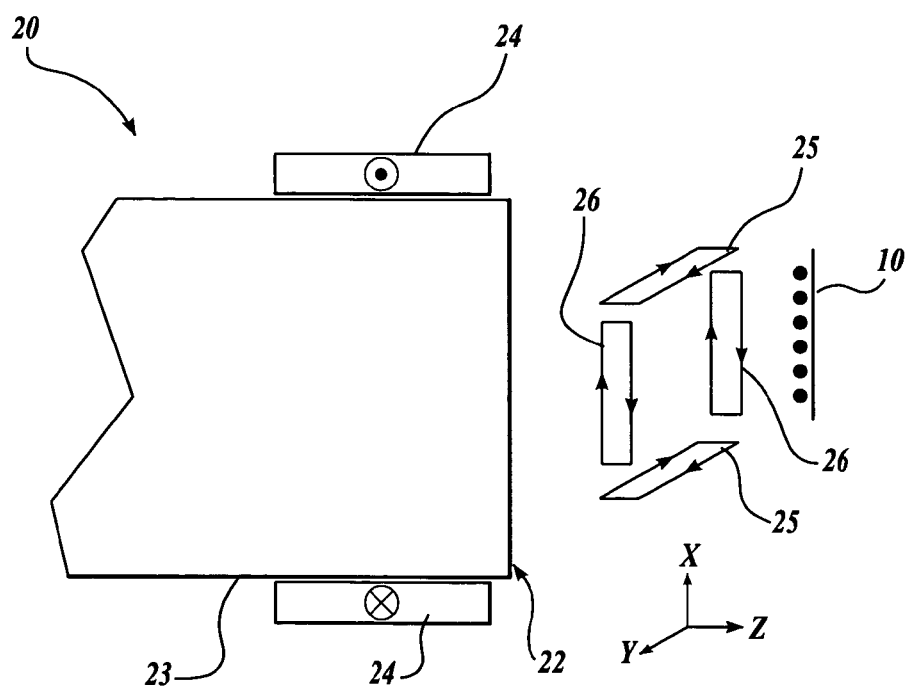
FIG. 2 schematically illustrates an arrangement for reading an NMR/NQR label, such as shown in FIG. 1, with an NMR or NQR spectrometer, formed in accordance with one embodiment of the present invention.

FIG. 2 shows a sample physical layout for a magnetic resonance or quadrupole resonance spectrometer 20 for reading an NMR/NQR label 10, in accordance with the first embodiment of a system of the present invention. The spectrometer 20 generally consists of a main magnet 22 having a pole piece 23 and winding 24 placed on the pole piece 23, two RF transmitter coils 25, and two receiver coils 26. Current flowing through the windings 24 of the main magnet 22 along with the pole piece 23 of the main magnet 22 produce a magnetic field, at the position of the NMR/NQR label 10, which is predominantly in the Z direction. The circled dot and the circled x in the upper and lower parts of the windings 24 of the main magnet 22 denote the direction of the current flow circumferentially in the multi-turn windings 24.

It should be noted that, for an NQR label, the main magnetic field may not be necessary. It should also be noted that the main magnetic field may be turned off or made smaller by lowering the current level through the windings 24 between measurements to save power or create less heat. Furthermore, for certain types of nuclear or quadrupole spins, it may be possible to create a suitable main magnetic field even with an air core. In this case, no iron pole piece 23 is required in the main magnet 22, such that the main magnetic field can be rapidly and easily varied because of the lower magnet inductance.

Figure 3:
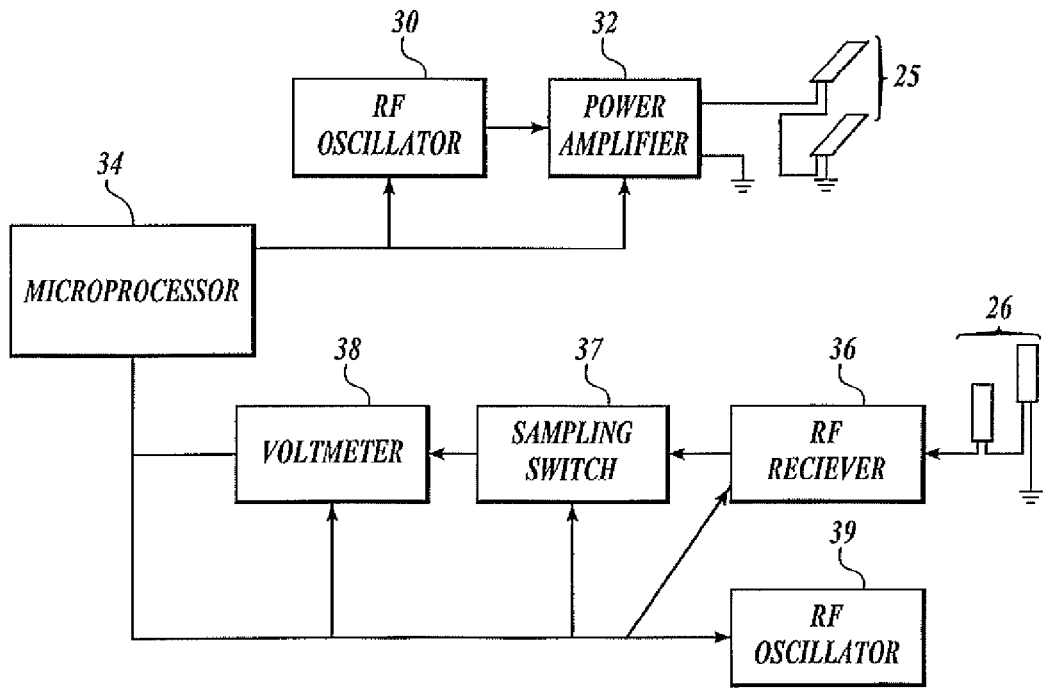
FIG. 3 illustrates an electronic circuit arrangement for use with the NMR or NQR spectrometer of FIG. 2, in accordance with one embodiment of the present invention.

RF power fed to the two RF transmitter coils 25 produces a pulsed AC magnetic field in the ±X direction that is suitably spatially uniform over the surface of the label 10. In one embodiment, these coils 25 may be a set of multi-turn Helmholtz coils. Each of the coils 25 is generally rectangular with the longer dimension extending in the Y direction, as illustrated. The plane of each of the coils 25 is generally perpendicular to the X axis. The small arrows in the coils 25 show the direction of current flow necessary to produce the desired magnetic field direction. The RF frequency, amplitude, and also perhaps phase of the current is controlled by detector (i.e., label reader) electronics as shown in FIG. 3 to be described below. The RF field is manipulated in such a way that the nuclear magnetic moments or quadrupole moments of the spot on the label 10 produce an oscillating magnetic field at the receiver coils 26 in the ±Y direction.

The receiver coils 26 are similar to the transmitter coils 25, except that their long dimension extends in the X direction and the plane of the coils 26 is generally perpendicular to the Y axis. The techniques involving the transmitter and receiver coils 25 and 26 are well known in the art. It should be noted that a magnetic resonance or quadrupole resonance spectrometer, as described in FIG. 2, may be capable of determining the positions of spots only when the spots are fairly large and thick, due to somewhat limited spatial resolution and sensitivity of such spectrometer. It should further be understood, however, that the layout as illustrated in FIG. 2 and described above is for illustrative purposes only, and various other arrangements and layouts for implementing magnetic resonance or quadrupole resonance spectrometers are possible.

FIG. 3 illustrates an electronic circuit arrangement for a representative NMR/NQR spectrometer as shown in FIG. 2. In FIG. 3, the transmitter coils 25 are used to produce a pulsed radio frequency (RF) magnetic field in the vertical (±X) direction to initiate the magnetic response of the nuclear spins of the NMR/NQR label particles. The RF power for this is provided by a digitally controlled variable frequency RF oscillator (VFO) 30, and a broadband power amplifier 32. The amplitude and frequency (and also perhaps phase) of the RF oscillator 30 can be controlled by a microprocessor or computer 34.

The oscillating magnetic field produced by the NMR/NQR label magnetic particles induces a voltage and current in the receiver coils 26, which are amplified and detected by a tunable RF receiver 36. The signal amplitude is sampled at the desired times using a sampling switch 37 and measured by a digital voltmeter 38, and then stored by the microprocessor 9. Also, the RF output from a digitally controlled variable frequency RF oscillator (VFO) 39 is used to control the receiving frequency of the receiver coils 26. The RF frequency detected by the RF receiver 36, the sensitivity of the receiver 36, the timing of the sampling switch 37, and the digital voltmeter 38 are all controllable programmatically by the microprocessor 34 in a desired sequence of events, as is well known in the magnetic resonance art.

One preferred embodiment of the NMR/NQR spectrometer, as described above in reference to FIGS. 2 and 3, includes the receiver coils 26 and perhaps also the transmitter coils 25 that are made small and controllably movable by the microprocessor 34 in the XY plane (e.g., by using piezo-movers) so that signals from a single spot 11 in a particular position on the label 10 can be distinguished. This embodiment makes it possible to use fewer distinguishable NMR/NQR particles to form the spots, while still being able to store the same or more information in a given label area.

For example, in this embodiment, each spot may be formed of two or more particles, each having a specific magnetic resonance frequency. With the transmitter coils 25 and the receiver coils 26 placed at the first position, an RF pulse of certain frequency is sent to the transmitter coils 25 and detected by the receiver coils 26 so that the microprocessor 34 can store a binary value for this frequency, i.e., for this type of particles (e.g., 1 for present and 0 for absent). The microprocessor 34 then initiates a new measurement cycle, and commands that an RF pulse of the next frequency be sent to the transmitter coils 25 and detected by the receiver coils 26. Another binary value (e.g., 1 for present and 0 for absent) for this frequency is then stored by the microprocessor 34. This process is repeated until all the necessary NMR/NQR label frequencies have been checked. The microprocessor 34 decodes the stored binary values for this spot of the label 10 and stores the decoded result as the first character of the stored label information. The RF transmitter and receiver coils 25, 26 are then moved to the next position with respect to the label 10 by the microprocessor 34 and the process is repeated until all the spots of the label have been read.

Figure 4:
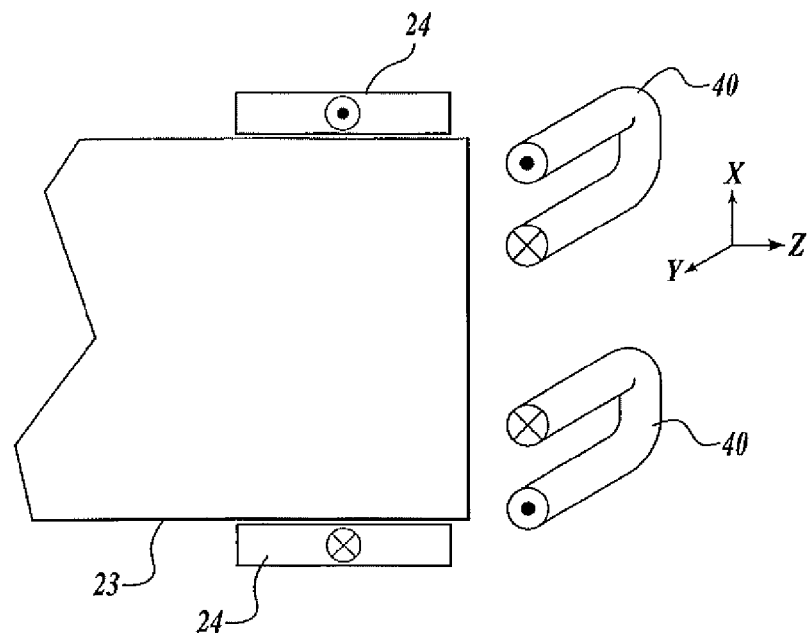
FIG. 4 schematically illustrates an arrangement for reading an NMR/NQR label using magnetic resonance imaging techniques, in accordance with one embodiment of the present invention.

According to the second embodiment of a system for reading NMR/NQR labels, magnetic resonance imaging (MRI) techniques are used. The physical and circuit arrangement for a MRI-based system is the same as for a spectrometer-based system described above in reference to FIGS. 2 and 3, except that in the MRI-based system coils are necessary to produce X- and Y-field gradients of the main magnetic field. An arrangement to achieve this for the vertical (X-field) gradient is shown in FIG. 4. The coils 40 to produce this gradient, shown cut away, are a pair of rectangular windings, which are longer in the Y direction (in and out of the page) than in the X direction. Each of these coils 40 is a multi-turn winding, and the direction of the current is shown by the dot and x at the ends of the cut-away view. It should be noted that the current flow is clockwise (as viewed looking to the left or in minus Z direction) in the upper winding, and in the opposite direction in the lower winding.

For a complete MRI-based NMR/NQR label readout device, two additional similar but vertically oriented coils are necessary. They produce a horizontal (Y-field) gradient of the main magnetic field, but they are not shown in FIG. 4 to simplify the diagram.

By controlling the current in the two pairs of gradient coils (only the X-field pair of coils 40 are shown), the value of the Z component of the main magnetic field can be adjusted so that the resonance frequency (for a given magnetic resonance material) at any X-Y position on the label can be varied. By carrying out a sequence of RF transmitted pulses, receiver frequency adjustments and sampling, X and Y field gradient coil current adjustments, and data manipulation, the signals for different label spots can be distinguished and the coded information or text from the label can be decoded and stored by the microprocessor 34. Thus, the MRI-based system, as shown in FIG. 4, has the advantage of being easily able to distinguish the position of each spot on the label 10 without any mechanical motion of the reader mechanism (including, for example, the receiver coils 26 and the transmitter coils 25) once the reader mechanism is placed within detection distance of the label 10.

As with the first embodiment described above, it should be understood by one skilled in the art that the layout as illustrated in FIG. 4 and described above is for illustrative purposes only, and various other arrangements and layouts for implementing an MRI-based detector are possible.

Figure 5:
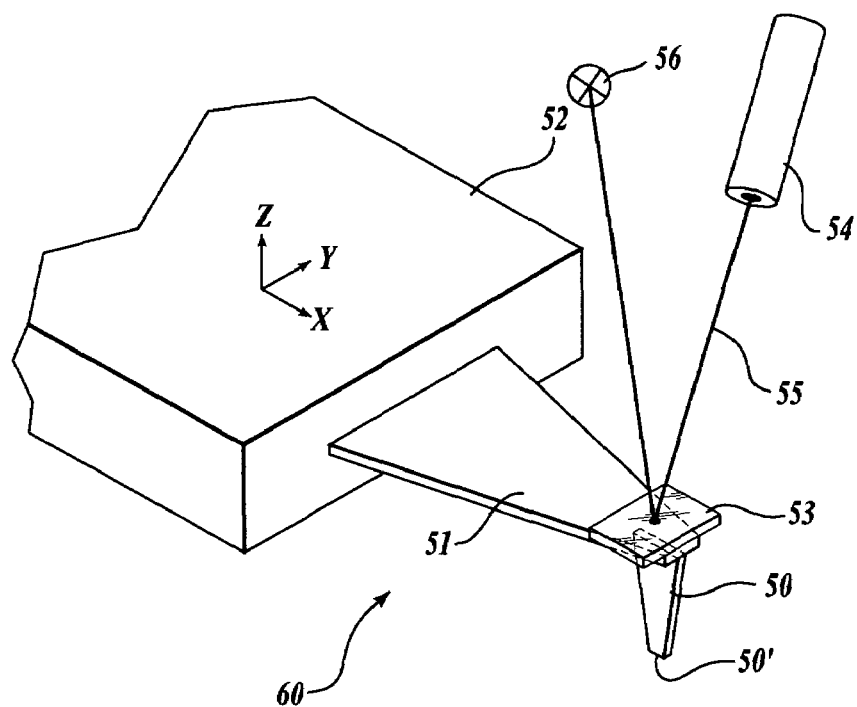
FIG. 5 schematically illustrates a magnetic resonance force microscope for reading an NMR/NQR label, formed in accordance with one embodiment of the present invention.

FIG. 5 illustrates a simplified physical arrangement of a magnetic resonance force microscope 60, which is the third embodiment of a system suitable for reading an NMR/NQR label according to the present invention. This embodiment is capable of detecting very small amounts of material (even 1 spin) though typically requires very near proximity of the probe (i.e., microscope) to the material to be detected. Thus, in some applications, the size of the surface of the probe which interacts with the label may be increased so as to create a more robust (though lower-resolution) version of the system.

In the system of FIG. 5, a scanning probe tip 50 is attached to the tip of a cantilever 51. For the purpose of reading NMR/NQR labels, the scanning probe tip 50 would be blunt and flat at the end 50' of the tip. The size of the flat end 50' would be approximately the size of the NMR/NQR label spots for this application. The probe tip 50 (or at least its end 50') is formed of a magnetic (though not a permanent magnet) material so that the magnetic field from the processing spins of any NMR/NQR material will alternately attract and repel the tip 50 (or at least its end 50') and thus make the cantilever 51 vibrate. The mechanical resonance frequency of the cantilever 51 and the scanning probe tip 50 is arranged to be the same as the magnetic resonance frequency to achieve maximum sensitivity.

The cantilever 51 is supported by a mounting 52 which can be moved in the X, Y, and Z directions with both coarse and fine motion control (not shown) by the microprocessor 34. This may be typically achieved using piezo-movers.

There is a small mirror 53 mounted on the back of the cantilever 51 above (or opposite from) the probe tip 50. A laser source 54 produces a collimated beam 55, which reflects from the mirror 53 onto the center of a quadrature detector 56. This detector is at some distance from the cantilever 51 for high sensitivity motion detection (not drawn to scale). Motion of the cantilever 51 causes the reflected beam to move on the quadrature detector 56, changing the signals from the four photosensitive diodes included in the detector.

Figure 6:
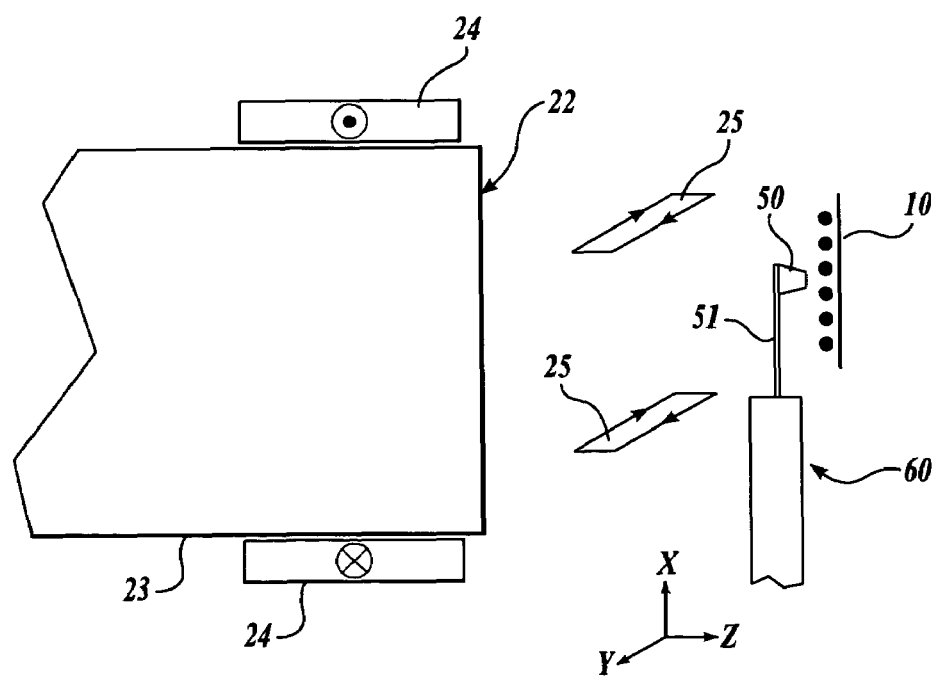
FIG. 6 schematically illustrates an arrangement for reading an NMR/NQR label using the magnetic resonance force microscope of FIG. 5, in accordance with one embodiment of the present invention.

FIG. 6 schematically illustrates a physical arrangement that uses a magnetic resonance force microscope 60 of FIG. 5 to detect signals from an NMR/NQR labels 10. The magnet 22 consisting of the pole piece 23 and the windings 24, and the RF transmitter coils 25 are just as explained in reference to FIG. 2 above for an NMR/NQR spectrometer-based detector. As before, the use of an air core main magnet, and eliminating the main magnet 22 for NQR labels, are also possible for this magnetic resonance force microscope arrangement.

The magnetic resonance force microscope 60 is placed with the tip 50 almost in contact with the label 10, and such that the tip 50 can be moved over the coded label surface in the X and Y directions. The tip 50 is moved to be near each spot of the NMR/NQR label in succession, and the NMR/NQR label particles' (or materials') spins are excited with the transmitter coils 25 to initiate the magnetic response similarly as in the spectrometer-based detector as explained in reference to FIG. 3.

The signal from the quadrature detector (56 in FIG. 5) is amplified, detected, sampled, digitized, decoded, and stored by the microprocessor 34, similarly to how the signal is processed in the spectrometer-based detector as explained in reference to FIG. 3.

It should be understood by one skilled in the art that the layout as illustrated in FIGS. 5 and 6 and described above is for illustrative purposes only, and various other arrangements and layouts for implementing a magnetic resonance force microscope are possible.

Figure 7:
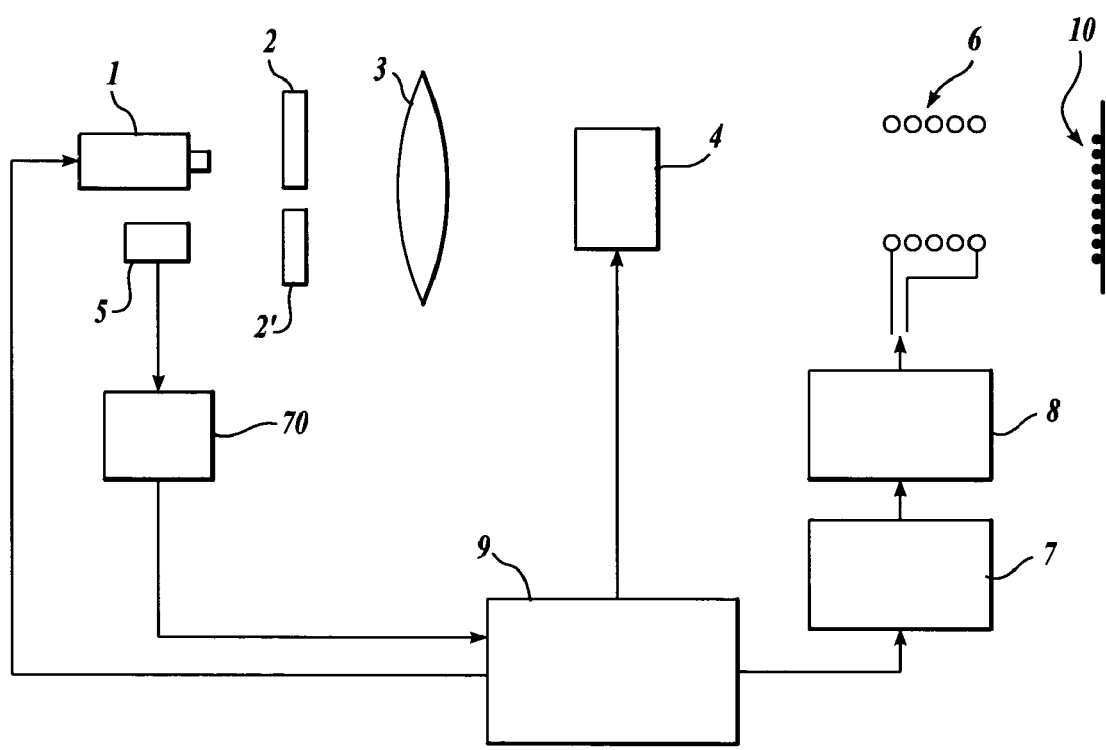
FIG. 7 schematically illustrates an arrangement for reading an NMR/NQR label using an optically enhanced and optically detected NMR or NQR reader in accordance with one embodiment of the present invention.

FIG. 7 is a schematic diagram of the mechanical, optical, and electrical parts of an optically enhanced and optically detected NMR or NQR reader, in accordance with the fourth embodiment of a system for reading NMR/NQR labels according to the present invention.

Briefly, the method of optically enhanced and optically detected NMR or NQR involves shining a circularly polarized laser light beam on a label which has an optical absorption line at the laser wavelength. The response from the label is read with another laser beam. Because the readout is done using optical photons rather than the radio frequency photons for normal NMR or NQR, the sensitivity is independent of the radio frequency of the NMR or NQR frequency. This means that NMR can be done at low magnetic fields. In addition, optically enhanced and optically detected NMR or NQR can have more than 10 orders of magnitude higher sensitivity than magnetic resonance or quadrupole resonance spectrometers as described in reference to FIGS. 2 and 3 above. Thus, use of this method makes it possible to construct a compact, low mass, and very fast non-contact reader for NMR/NQR labels. Because the readout would be done with a laser beam, the excitation and readout beams could be easily scanned and could provide very high spatial resolution. Furthermore, because of the high sensitivity, it could detect very small amounts of the NMR/NQR label materials.

In FIG. 7, a laser source 1 produces a laser beam for aligning and detecting the nuclear spins. A polarizer 2 circularly polarizes the laser light transmitted to the label 10. A focusing assembly 3 is to decrease the laser beam size to a size appropriate for reading the array of NMR/NQR spots on the label 10. The focusing assembly 3 also collects the reflected laser light, which is used to determine the NMR/NQR frequencies by optical detection. The focusing assembly 3 may be either a lens assembly or mirror assembly, or a combination of both lenses and mirrors. A two-dimensional deflection assembly 4 is provided for steering the laser beam both laterally and vertically on the surface of the label 10, and initially steers the beam to the first spot of the NMR/NQR label 10. A photodetector 5 (e.g., a semiconductor photodiode or avalanche diode) converts the laser light reflected by the NMR/NQR label 10 and focused by the focusing assembly 3, which then passes through a detector polarization analyzer 2', to an electrical signal.

A coil 6 (shown in cross section) is used to produce a pulsed radio frequency (RF) magnetic field necessary to initiate the magnetic response of the nuclear spins of the NMR/NQR label materials (or particles). The RF power for this is provided by an RF oscillator 7, and a broadband power amplifier 8. The amplitude and frequency of the RF oscillator 7 can be controlled by a microprocessor 9. The microprocessor 9 also controls the amplitude of the laser source 1 and the position of the laser beam by controlling the steering assembly 4. Detection electronics 70 amplify and measure the signal from the photodetector 5. If nuclei are present in the label spot (e.g., the first spot) in the label 10 as detected based on an NMR or NQR resonance, the amplified signal from the photodetector 5 varies in amplitude at the NMR/NQR resonance frequency. The presence or absence of a signal at this RF frequency is stored by the microprocessor 9 as a binary value for the spot being observed.

The microprocessor 9 then initiates a new measurement cycle for laser 1, and then commands that an RF pulse of the next frequency be sent to the coil 6 and detected. Another binary value is then stored. This process is repeated until all the necessary NMR/NQR label frequencies have been checked. The microprocessor 9 decodes the stored binary values for this spot of the label and stores the decoded result as the first character of the stored label information. The laser beam from the laser source 1 is then steered to the next spot of the label by the microprocessor 9 and the process is repeated until all the spots of the label have been read.

It should be understood by one skilled in the art that the layout as illustrated in FIG. 7 and described above is for illustrative purposes only, and various other arrangements and layouts for implementing an optically enhanced and optically detected NMR or NQR reader are possible.

As should be apparent from the foregoing description, a labeling method and system of the present invention offers various characteristics and advantages. First, labels formed in accordance with the present invention would be readable only by a magnetic resonance detector, and not by other label readers. Accordingly, the labels are suited for including proprietary or confidential information, which should not be readily readable by any conventional reader/detector. Second, the labels according to the present invention may be made readable by humans (e.g., by arranging the spots 11 in a human-readable manner), or made unreadable or even invisible to humans, as desired. This feature may be useful for theft prevention and stolen goods tracing. Third, the labels can be produced inexpensively as compared to, for example, conventional printed bar codes. Fourth, the labels can be made of organic or other material that is not dangerous to people, and/or can be made of recyclable material. Fifth, the label readers (i.e., magnetic resonance detectors) of various embodiments consisting of a magnetic resonance force microscope detector or an optically enhanced and optically detected NMR or NQR reader could have much higher spatial resolution than currently available in high-volume label methods. These readers could enable design and use of very small labels or of labels containing more information than current label technology. Sixth, an optically enhanced and optically detected NMR or NQR reader could be very fast and have very high spatial resolution in non-contact reading of the labels.

While the preferred embodiments of the invention have been illustrated and described, it will be appreciated that various changes can be made therein without departing from the spirit and scope of the invention.

The embodiments of the invention in which an exclusive property or privilege is claimed are defined as follows:

1. A method for making and reading a label, comprising:
providing particles having different magnetic resonance characteristics;
selectively placing one or more of the particles in an array on or in an item to form a label;
providing an optically enhanced and optically detected Nuclear Magnetic Resonance or Nuclear Quadrupole Resonance reader for detecting magnetic resonance characteristics of the one or more of the particles placed in the array on or in the item, the reader including a deflection assembly for steering a laser beam; and controllably steering the laser beam of the reader relative to the array so as to determine which particles are present in which different positions in the array, respectively, on or in the label based on the detected magnetic resonance characteristics.

2. The method of claim 1, wherein the step of selectively placing one or more of the particles on or in an item comprises selecting a combination of particles having different magnetic resonance characteristics.

3. The method of claim 1, wherein the item comprises a substrate for forming a label, and the step of selectively placing one or more of the particles on or in an item comprises thereby forming the label.

4. The method of claim 1, wherein the step of selectively placing one or more of the particles on or in an item further comprises:
   preparing sets of particles, each set containing a different group of one or more of the particles such that the different sets signify different digital characters, respectively; and
   selectively placing the sets of particles on or in an item to form a label.

5. The method of claim 1, wherein the array comprises a one-dimensional array.

6. The method of claim 1, wherein the array comprises a two-dimensional array.

7. The method of claim 1, wherein the step of selectively placing one or more of the particles on or in an item comprises using a printing or painting method selected from the group consisting of letter press, mechanical ink jet printing, and thermal ink jet printing.

8. The method of claim 1, wherein the step of providing particles having different magnetic resonance characteristics comprises choosing chemical compounds containing different nuclei with a magnetic moment.

9. The method of claim 1, wherein the step of providing particles having different magnetic resonance characteristics comprises choosing chemical compounds containing different spin-spin relaxation time (T2).

10. The method of claim 1, wherein the step of providing particles having different magnetic resonance characteristics comprises choosing chemical compounds containing different chemical shifts or chemical shift patterns.

11. The method of claim 1, wherein the step of providing particles having different magnetic resonance characteristics comprises choosing chemical compounds containing different nuclear quadrupole resonance frequencies.

12. A system for reading a label, comprising:
   a label comprising particles having different magnetic resonance characteristics, the particles being selectively placed in an array on or in the label; and
   a magnetic resonance or quadrupole resonance spectrometer including controllably movable receiver coils, the spectrometer being configured to detect magnetic resonance characteristics of the particles placed in the array on or in the label so as to determine which particles are present in which different positions in the array, respectively, on or in the label based on the detected magnetic resonance characteristics.

13. The system of claim 12, wherein the label comprises sets of particles, each set containing a different group of one or more of the particles such that the different sets signify different digital characters, respectively.

14. A system for reading a label, comprising:
   a label comprising particles having different magnetic resonance characteristics, the particles being selectively placed in an array on or in the label; and
   an optically enhanced and optically detected Nuclear Magnetic Resonance or Nuclear Quadrupole Resonance reader including a deflection assembly for steering a laser beam, the reader being configured to detect magnetic resonance characteristics of the particles placed in the array on or in the label so as to determine which particles are present in which different positions in the array, respectively, on or in the label based on the detected magnetic resonance characteristics.

15. The system of claim 14, wherein the label comprises sets of particles, each set containing a different group of one or more of the particles such that the different sets signify different digital characters, respectively.

* * * * *